United States Patent [19]

Ozimek et al.

[11] Patent Number: 5,433,911
[45] Date of Patent: Jul. 18, 1995

[54] PRECISELY ALIGNING AND BONDING A GLASS COVER PLATE OVER AN IMAGE SENSOR

[75] Inventors: Edward J. Ozimek, Penfield; Herbert J. Erhardt, Rochester, both of N.Y.

[73] Assignee: Eastman Kodak Company, Rochester, N.Y.

[21] Appl. No.: 250,889

[22] Filed: May 31, 1994

[51] Int. Cl.6 .............. B29C 39/12; B29C 65/42; B29C 65/54
[52] U.S. Cl. .............. 264/261; 156/99; 156/101; 156/108; 156/292; 156/293; 269/43; 29/831
[58] Field of Search .............. 156/99, 101, 104, 108, 156/292, 293, 295; 264/261; 269/43; 250/208.1; 29/831

[56] References Cited

U.S. PATENT DOCUMENTS

| | | | |
|---|---|---|---|
| 3,622,419 | 11/1971 | London et al. | 156/99 X |
| 3,836,393 | 9/1974 | Ernsthausen et al. | 156/99 X |
| 3,919,452 | 11/1975 | Ettre et al. | 156/106 X |
| 3,957,537 | 5/1976 | Baskett et al. | 156/99 X |
| 4,184,903 | 1/1980 | Dillard et al. | 156/104 |
| 4,999,484 | 3/1991 | Kaneko | 250/208.1 |

Primary Examiner—Michael W. Ball
Assistant Examiner—Francis J. Lorin
Attorney, Agent, or Firm—Raymond L. Owens

[57] ABSTRACT

A method of precisely aligning and fastening a glass cover plate over an image sensor includes the use of first and second sets of spacers arranged so that the glass cover plate is provided on the base plate and the image sensor is provided on the first set of spacers and spaced from a carrier mounted on the second set of spacers. An adhesive secures the glass cover plate to the image sensor as well as the image sensor to the carrier.

4 Claims, 1 Drawing Sheet

PRECISELY ALIGNING AND BONDING A GLASS COVER PLATE OVER AN IMAGE SENSOR

FIELD OF THE INVENTION

The present invention relates to packaging of image sensors wherein a glass cover plate is bonded to an image sensor.

BACKGROUND OF THE INVENTION

In a typical assembly of an image sensor in its electronic package, tolerances on the order of 0.001 inch or more are commonly used for the placement of the sensor in its package as well as for the distance of separation between the cover glass and the image sensor surface. The thickness of an electrically conductive adhesive between the image sensor and an insulating carrier depends upon the amount of adhesive which is dispensed, and the use of optical adhesives to attach a glass window or filter to the sensor surface is likewise dependent upon the volume applied. In some applications, it is very important that the spacing between the image sensor and the carrier and/or glass be held to within exacting tolerances. In order to place the components of an optical system to extreme tolerance values (∼5 microns), special assembly tools and techniques are required.

SUMMARY OF THE INVENTION

It is an object of the present invention to provide a more effective method for bonding a glass cover plate to an image sensor while maintaining exacting dimensions.

This object is achieved in a method of precisely aligning and fastening a glass cover plate over an image sensor comprising:

(a) placing a glass cover plate over a optically flat transparent spacer plate;

(b) providing a first set of spacers secured to the spacer plate and upon which are mounted the image sensor so that the image sensor is spaced from the cover plate such that the spacing is critically controlled to be within a few microns of tolerance;

(c) providing a second set of spacers spaced from the first set of spacers and mounted on the spacer plate;

(d) mounting a carrier on the second set of spacers so that it is spaced from the image sensor, the arrangement being such that the carrier surface opposed from the spacer plate surface are parallel to within less than a 1000th of a radian;

(e) dispensing an optical adhesive between the glass cover plate and the image sensor to secure the glass cover plate to the image sensor; and (f) dispensing an electrically conductive adhesive between the image sensor and the carrier to secure the image sensor to the carrier.

It is a feature of this invention to efficiently assemble a focal plane array image sensor having critical and demanding tolerances requiring the assistance of precision fixtures. Eliminating the variability of adhesive bond line thickness by using precision spacer elements has been found to be effective. The ability to monitor the assembly process to avoid gas/particulate entrapment is extremely valuable in assuring a good optical path.

Further features include: (1) an inverted packaging process which utilizes gravity to help contain the possible excess volume of adhesive materials; (2) the use of a transparent base material so as to visually monitor the assembly; (3) having a very flat base surface to use as a means of checking the flatness of the glass cover surface and for assuring a very accurate vertical (z-axis) distances; (4) a fixture for periodically calibrating the critical spacer element dimensions; and (5) the repeatability of the assembly process is improved so that multiple image sensors will be able to be assembled with reference to a spacer plate surface and retain the same critical dimensionality.

DETAILED DESCRIPTION OF THE PREFERRED EMBODIMENTS

Figure 1:
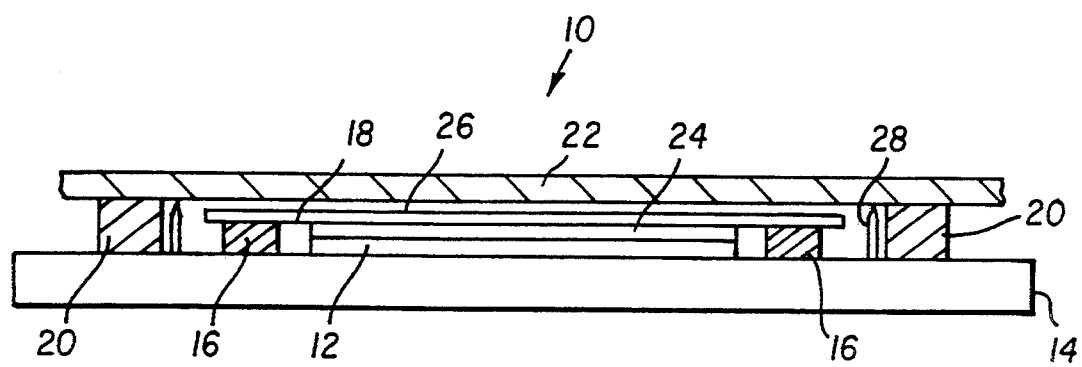
FIG. 1 is a side elevational view of the components necessary to precisely align a glass cover plate over an image sensor.

Turning first to FIG. 1, a fixture or assembly provides the components necessary for aligning and securing a glass cover plate 12 to an image sensor 18. Image sensors are frequently referred to in the art as "dies". As shown a spacer plate 14 is made of glass. Its optically flat surface is within a couple of fringes. When the glass cover plate 12 is mounted on the spacer plate 14, the resultant interference fringes will show the surface quality of the cover glass plate. Being transparent, a reverse stereo microscope can be used to closely watch the assembly as it occurs. Precision ground and lapped first and second sets of spacers 16 and 20 are mounted on the spacer plate 14 by drilling and tapping the two pieces or by attachment using an adhesive.

Figure 2:
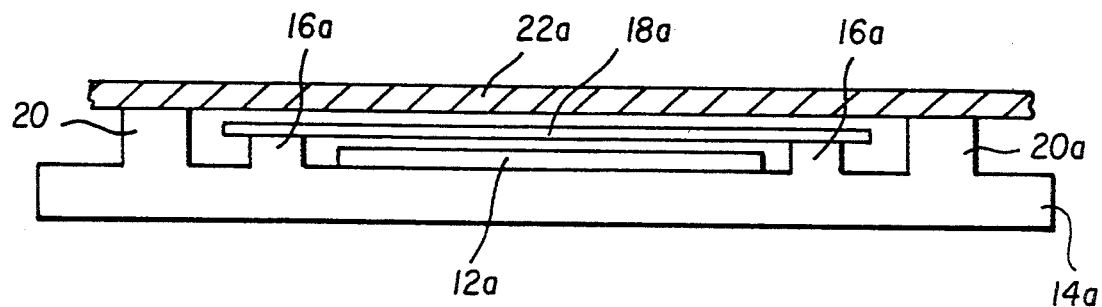
FIG. 2 is a schematic of a single glass block which includes first and second spacers shown in FIG. 1.

In FIG. 2, where the assembly components are the same as FIG. 1, they will have the same numerals. However, the first and second sets of spacer 16a and 20a are shown in FIG. 2 to be formed from a single glass block 14a. The first set of spacers 16 accommodate the glass cover plate 12. The second set of spacers 20 accommodate a carrier 22. This carrier can, depending upon the application, be conductive or non-conductive. The carrier is formed from $Al_2O_3$ or AlN. The image sensor 18 rests on the first set of spacers 16 whereas the cover glass plate 12 directly contacts the spacer plate 14. Being able to see through the spacer plate 14 aids in the spatial positioning of the image sensor/glass cover plate (12, 18) as well as verifying the absence of entrapped gas bubbles and particulates. The optical adhesive 24 is dispensed onto the cover glass plate in sufficient quantity to fill the volume created by the first set of spacers 16. Bleedouts aid in removing excess adhesive. Once placed, curing can occur at room temperature or may be accelerated by the use of an oven. An example of the optical adhesive is Dow Corning 93-500 Space-grade encapsulant, Dow Corning Corp., Midland, Mich.

Additional spacers for the carrier/die attachment can be provided on this base or positioned on another base plate (i.e., two separate spacers). If two spacers are used, the spacer plate material need not be glass since the optical path is now blocked due to the image sensor. These spacers control the bond line thickness of the image sensor attach adhesive 26. This adhesive is electrically conductive and compliant and should be stress free so as not to distort the image sensor surface. An example of such a conductive adhesive is Zymet, Inc., ZVR-6000, E. Hanover, N.J. Positioning of the image sensor can be accomplished using the spacer elements as reference points or using optical targets on the individual pieces. If the spacers are removed sufficiently from the image sensor element, "dams" 28 could be incorporated on spacer plate 14 to prevent the flow of adhesive onto the bond pads of the carrier.

Critical dimensions include the distance of the top surface of the glass cover plate to the top of the image sensor element as well as the parallelism between the top surface of the glass cover plate and the top of the carrier. This parallelism can be held to better than 0.001 radian. Due to these demanding tolerances, assembly in a very clean environment in many cases will be essential.

Reviewing, FIG. 1 shows the spacer plate 14 which the image sensor 18 (die) is placed. On top of the image sensor 18 is placed a glass cover plate 12. In a particular application, the bottom surface of the glass cover plate 12 (see FIG. 1) which is farthest from the image sensor 18 is used as a reference plane. Its flatness (distance from the imager sensor 18) is critical as well as its parallelism to the carrier surface.

Not only will assembly according to this invention hold the dimensions within the tolerance limits, but it will also afford repeatability of the assembly process. Such a spacer, having a spacer plate, is used to meet these requirements. The process is inverted (i.e., upside-down) and components are viewable through the spacer plate during the actual assembly. Precision machined spacer "steps" maintain the required spacing accurately.

The invention has been described in detail with particular reference to certain preferred embodiments thereof, but it will be understood that variations and modifications can be effected within the spirit and scope of the invention.

PARTS LIST 10 assembly
12 glass cover plate
14 spacer plate
16 inner spacers
18 image sensor
20 outer spacers
22 insulating carrier
24 optical adhesive
26 electrically conducting adhesive
28 "dams" for blocking adhesive flow

We claim:

1. A method of precisely aligning and fastening a glass cover plate over an image sensor comprising:
    (a) placing a glass cover plate over a optically flat transparent spacer plate;
    (b) providing a first set of spacers secured to the spacer plate and upon which is mounted the image sensor so that the image sensor is spaced from the cover plate such that the spacing is critically controlled to be within a few microns of tolerance;
    (c) providing a second set of spacers spaced from the first set of spacers and mounted on the spacer plate;
    (d) mounting a carrier on the second set of spacers so that it is spaced from the image sensor, the arrangement being such that the carrier surface opposed from the spacer plate surface are parallel to within less than a 1000th of a radian;
    (e) dispensing an optical adhesive between the glass cover plate and the image sensor to secure the glass cover plate to the image sensor; and
    (f) dispensing an electrically conductive adhesive between the image sensor and the carrier to secure the image sensor to the carrier.

2. The method of claim 1 wherein the first and second spacers are formed from the same glass block.

3. The method of claim 2 further including removing the spacers and spacer plate from the previously formed structure.

4. The method of claim 2 wherein the carrier is formed from $Al_2O_3$ or AlN.

* * * * *